United States Patent [19]

Niuya et al.

[11] Patent Number: 5,675,533
[45] Date of Patent: Oct. 7, 1997

[54] SEMICONDUCTOR DEVICE

[75] Inventors: Takayuki Niuya; Yuji Iwasawa, both of Tsukuba, Japan

[73] Assignee: Texas Instruments Incorporated, Dallas, Tex.

[21] Appl. No.: 697,395

[22] Filed: Aug. 23, 1996

Related U.S. Application Data

[63] Continuation of Ser. No. 311,799, Sep. 26, 1994, abandoned.
[51] Int. Cl.$^6$ .................................................. G11C 11/34
[52] U.S. Cl. ........................... 365/175; 365/72; 365/182; 257/368; 257/471; 257/481; 257/603
[58] Field of Search .............................. 365/174, 175, 365/182, 72; 257/368, 471, 481, 603

[56]  References Cited

U.S. PATENT DOCUMENTS

| | | | |
|---|---|---|---|
| 4,701,883 | 10/1987 | Wrathall et al. | 365/175 X |
| 4,845,681 | 7/1989 | Vu et al. | 365/175 X |
| 5,032,891 | 7/1991 | Takagi et al. | 365/175 X |
| 5,267,192 | 11/1993 | Nogami | 365/175 X |

*Primary Examiner*—Do Hyun Yoo
*Attorney, Agent, or Firm*—William B. Kempler; Richard L. Donaldson

[57] ABSTRACT

A latch-type SRAM memory cell having a number of MOS transistors arranged to maintain symmetry with each other circuitwise, in which the source regions of the MOS transistors are arranged so as to be adjacent semiconductor regions of opposite conductivity with respect thereto. Zener diodes are formed between the adjacent source and semiconductor regions with each of these Zener diodes being connected between their respective source regions and a power supply. Since current to each source region of paired MOS transistors flows effectively to the power supply or ground side via a Zener diode using a tunneling effect, a rise in the source region potential can be reduced, and an increase in the transistor threshold value can be controlled. In this way, symmetry of the paired transistors can be maintained, and the performance of the memory cell, e.g., memory cell data retention ability and drive current ability, can be increased. In addition, a high degree of integration and miniaturization of the device can be achieved with the Zener diodes, and a large degree of tolerance can be obtained for fluctuations in silicification conditions and fluctuations in surface concentration of the source and drain regions, as well as for variations during contact formation. Because of this, it will be possible to produce good quality, highly integrated semiconductor devices at high yields.

6 Claims, 14 Drawing Sheets

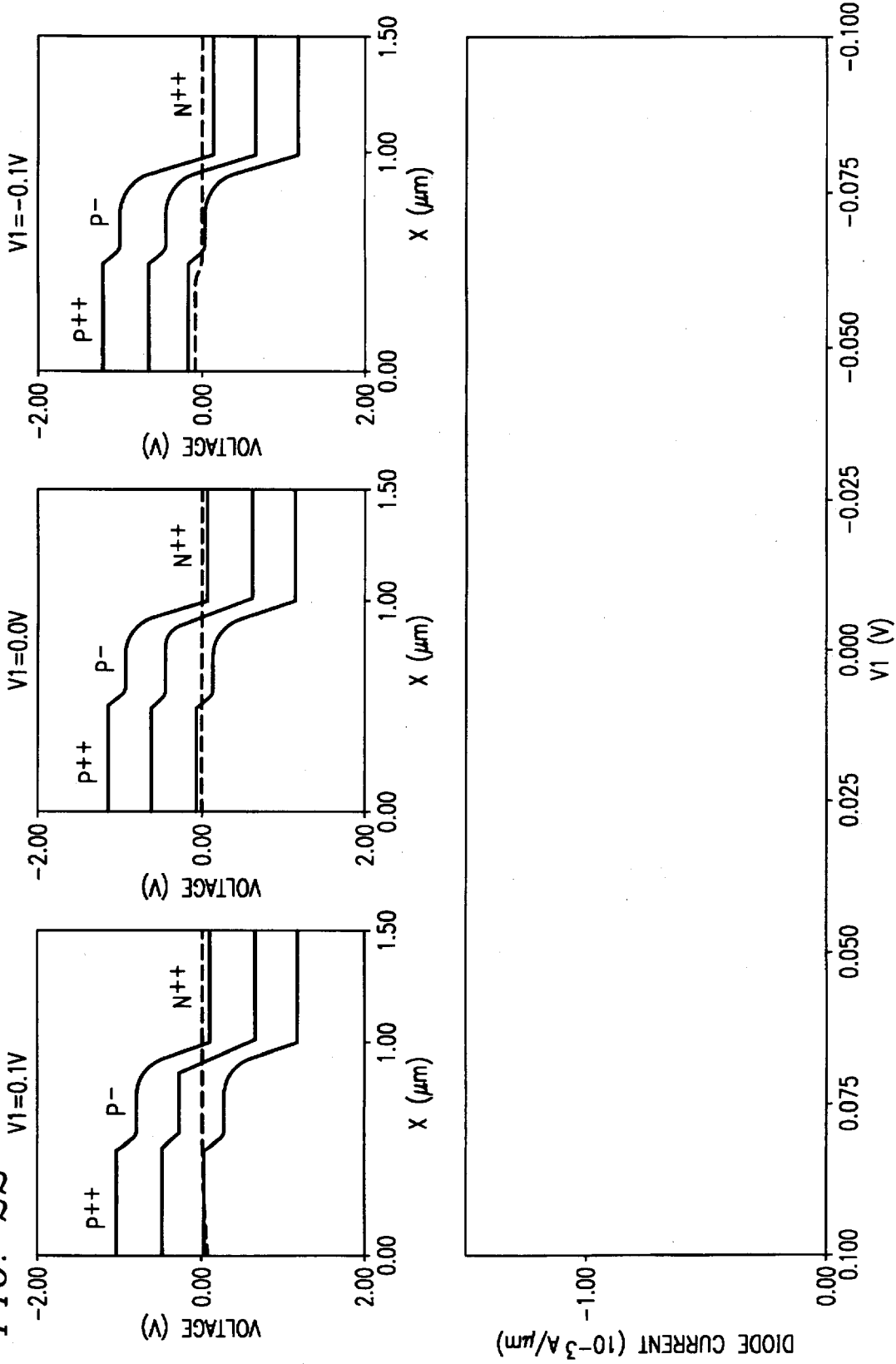

SEMICONDUCTOR DEVICE

This application is a continuation, of application Ser. No. 08/311,799, filed Sep. 26, 1994, now abandoned.

This invention relates to semiconductor devices, and in particular to a latch-type static memory or a sense amplifier in which a number of insulated-gate field-effect semiconductor elements, comprising a source region, a drain region, and a gate electrode installed between these regions with insulation film(s), are arranged symmetrical to each other to construct a balanced flip-flop.

BACKGROUND OF THE INVENTION

Conventional highly integrated latch-type static random-access memories (abbreviated SRAM hereinafter) with CMOS (complementary metal oxide semiconductor) construction are composed of memory cells with the circuit structure shown in FIG. 12.

These memory cells have n-channel MOS transistors $N_1$ and $N_2$ at the $Vss_1$ or $Vss_2$ power supply, which are placed symmetrical to each other circuitwise, and with p-channel MOS transistors $P_1$ and $P_2$ at the $Vdd_1$ or $Vdd_2$ power supply, which are placed symmetrical to each other circuitwise. They are composed of a CMOS flip-flop in which the input and output of the CMOS inverter pair, connected to one end of each of these transistors $N_1$, $N_2$, $P_1$ and $P_2$, are connected and intersect each other in a balanced fashion, and the n-channel MOS transfer transistors represented by $X_1$ and $X_2$.

Input from bit line $B/L_1$ or $B/L_2$ is held in node Q or Q', via transistor $x_1$ or $x_2$ selected by word line $W/L_1$ or $W/L_2$, and data is thus written. The data are read using the reverse of this operation.

In short, with data "1" (node Q high level=Vdd level), $P_1$ and $N_2$ are on, and $N_1$ and $P_2$ are off. Otherwise, with data "0" (node Q low level=Vss level), $P_1$ and $N_2$2 are off and $N_1$ and $P_2$ are on. The result is that, in this cell, consumed current, except for leakage current, will flow between Vdd and Vss in the standby stage, making extremely small standby period power consumption possible.

This memory cell layout is shown in FIG. 13 (one memory cell) and FIG. 14 (a number of memory cells in the assembly). 1, 2, 3, 4, 5, 6, 7 and 8 in the figures represent each $n^+$-type semiconductor regions that serve as the source or drain region in each n-channel MOS transistor. 9, 10, 11, and 12 represent each $p^+$-type semiconductor region that serves as the source or drain region in each p-channel MOS transistor.

Also, transistors $P_1$ and $N_1$, and $P_2$ and $N_2$, have common gates $G_1$ and $G_2$. These gates are connected to semiconductor regions 11, 4, 7, 9, 2, and 5, of transistors $P_2$, $N_2$, $X_2$, $P_1$, $N_1$ and $X_1$, respectively, by connecting conductor LI, of TiN, etc., called a local interconnector. In addition, $p^+$-type semiconductor region 13, serving as a substrate contact substrate electrode, for fixing board potential to Vss, is formed adjacent (giving a pn junction) at the end section of semiconductor region 3 (source region) of transistor $N_2$.

These types of memory cells M-CEL are integrated with high density, as shown in FIG. 14, with adjacent memory cells forming a symmetrical shape with each other, using common prescribed semiconductor regions and Vss or Vdd power supply lines (not shown).

The memory cell layout described above, as illustrated in FIG. 13, in order to reduce cell area, uses a structure in which it is impossible to avoid a construction in which the moat connected to the power supply divides MOS transistors $N_1$ and $N_2$, which is the pair comprising the cell latch (in other words, a layout in which semiconductor regions 3 and 1 are placed apart), and where a board contact ($p^+$-type semiconductor region 13) is provided at one side (semiconductor region 3).

Previously, this board contact 13 only fixed the power supply to the board; it was thought that this ensured electrical stability of the board. As shown in FIG. 15, however, when the cell is constructed with high-concentration $n^+$-type silicon (source region) 3 and high-concentration $p^+$-type silicon (semiconductor region) 13 joined and electrically shorted by silicide layer 76, e.g., $TiSi_2$, at the top, and structured to be connected to power source $Vss_2$ through electrode 53 such as tungsten, etc., it is evident that reduction in Vss contact resistance at the source side of MOS transistor $N_2$ will be significantly affected. Here, silicide layers 77 and 58 are also provided on drain region 4 and polysilicon gate electrode $G_2$. In the FIG., 47 represents a $p^-$-type silicon substrate, 87 represents an $n^-$-type well region, and 50 represents a side wall of nitride, etc.

The reason that the aforementioned short circuit construction using silicide layer 76 significantly affects the reduction of Vss contact resistance is that, when a Zener diode ZD is formed with high-concentration $n^+$-type silicon 3 and high-concentration $p^+$-type silicon 13, and the Schottky barrier between $n^+$-type silicon 3 and silicide layer 76 is high because of fluctuations in the process, channel current (drain current) 120 flows to the Schottky diode SD sequentially between low-resistance $p^+$-type silicon 13 and silicide layer 76 via Zener diode ZD and will finally flow into $Vss_2$ current. It is believed that this leads to a great reduction in actual source Vss contact resistance.

The aforementioned phenomenon will be explained in terms of circuitry with FIG. 16. In the figure, $R_{NS}$, and $R_{NS}'$ represent contact resistance (30-1 kΩ) in source region 3 or in source region 1 and silicide layer 76, $R_{ps}$ represents the contact resistance (up to 10 Ω) of semiconductor region 13 and silicide layer 76, RZ represents the resistance (up to 100 Ω) (Zener diode resistance) caused by the junction of source region 3 and semiconductor region 13, and $R_{SUB}$ is the bulk resistance (up to 10 kΩ) of the silicon substrate, including semiconductor region 13. Thus, when Zener diode ZD resistance and resistance $R_{ps}$ between semiconductor region 13 and silicide layer 76 are considerably smaller than resistance $R_{NS}$ between source region 3 and silicide layer 76, current 120 will primarily flow to the power feed side through Zener diode ZD. This diode current may be 1 mA or more, and it will satisfactorily absorb the aforementioned channel current, since the transistor drive current is several hundreds of microamperes (less than 1 mA).

This type of phenomenon was measured quantitatively as shown below. In short, the structure shown in FIG. 15 was compared to a case in which regions 3 and 13 as shown in FIGS. 17 and 18 were formed independently (in the FIG., 40 represents a field oxide film and 49 represents a gate insulation film). It was proved that electrically noticeable differences would be caused, and as shown in Table I below, it was proved that a difference of about 0.2 V would be caused by MOS transistor threshold voltage and a difference of about 15% by current drive ability.

TABLE I

| PROCESSING CONDITIONS | | | DRIVE CURRENT RATIO Drain current (FIG. 15) with $p^+/n^+$ Zener diode Drain current (FIG. 17) without Zener diode, but with $p^+/p^-/n^+$ diode |
|---|---|---|---|
| Phosphorous dosage to source and drain regions (atoms/cm$^2$) | Thickness of TiSi$_2$ layer | $R_2 + R_D$* ($\Omega \cdot \mu m$) | |
| $1 \times 10^{14}$ | 800Å | 2678 | 1.153 |
| $1 \times 10^{14}$ | 700Å | 1997 | 1.166 |
| $4 \times 10^{14}$ | 800Å | 1546 | 1.178 |
| $4 \times 10^{14}$ | 700Å | 1396 | 1.162 |
| $8 \times 10^{14}$ | 800Å | 1068 | 1.157 |
| $8 \times 10^{14}$ | 700Å | 1060 | 1.159 |

*Sum of diffusion resistance of source and drain regions

This type of phenomenon has been resolved as follows by the present inventors. First, with the structure in FIG. 15, in which substrate electrode ($p^+$-type region 13) is placed adjacent to the source electrode moat (source region 3) of MOS transistor, in p-type substrate 47, for example, the substrate electrode moat is formed by high concentration $p^+$-type silicon 13 (impurity concentration of $1 \times 10^{20}$ atoms/cm$^3$). In contrast to this, the MOS transistor source moat is formed by high-concentration $n^+$-type silicon 3 (impurity concentration of $1 \times 10^{21}$ atoms/cm$^3$). When these two types of silicon are adjacent, a so-called Zener diode ZD is formed (refer to FIG. 19). Note that the impurity concentration profile shown in FIG. 19 was found with a two-dimensional process simulator: TSUPREM4 (made by TMA), and the silicide work function was established on the basis of normal TiSi$_2$ work function values with a MEDICI two-dimensional device simulator (made by TMA) (the same hereinafter).

A property of this Zener diode is that, even when it is as large as 0.1 μm, there will be a current of 1 mA or more caused by tunneling in 0.1 V reverse bias. In contrast to this, in FIG. 17, where substrate electrode moat 13 is placed separate from MOS transistor source electrode moat 3, as shown in FIG. 21, a normal n-type silicon and low-concentration p-type silicon junction will occur, and as shown in FIG. 22, there will be no current in a normal reverse bias state. This type of difference in voltage-current characteristics has a major effect on MOS transistor operation, and it is believed that it appears as the current drive ability, as shown in the aforementioned Table I.

Next, in the memory cells shown in FIGS. 13–15, substrate contact 13 is provided only at one side (Vss$_2$ side) as described above, and a silicide layer is provided on the surface of source region 1 at the side without the substrate contact (Vss$_1$ side). Although when the Schottky barrier between source region 1 and the silicide layer is high, the potential of $n^+$-type silicon 1 will rise above the substrate potential because of the Schottky barrier. In the resulting phenomenon, the threshold voltage of MOS transistor N1 will rise above the threshold voltage of MOS transistor N2 with its accompanying Zener diode, cell latch electrical symmetry will be destroyed, and destruction of cell data at the high Vcc side will readily occur. In addition to this problem, it has also been proved that there will be a drastic reduction in device performance.

First, as a problem with MOS transistors that have source and drain regions whose surfaces are coated with metal films (silicified) by a self-aligning silicification process, sufficient ohmic characteristics and sufficiently low resistance are not obtained because of the Schottky barrier between the silicide and silicon (i.e., aforementioned region 3, etc.) doped with a high impurity concentration.

Also, since it is difficult to evaluate these ohmic characteristics, there is the possibility that devices will be produced without regard for the aforementioned problem. The result is that, when sufficient ohmic characteristics have not been obtained at the boundary of the silicide and silicon in silicification, and when sufficiently low contact resistance has not been achieved, in MOS transistor N1, in which the substrate electrode moat is placed adjacent to the MOS transistor source electrode moat, there will be a rise relative to the silicide where the region on the source side is a Schottky junction.

This is shown in FIGS. 23–25 for transistor N1 and transistor N3, connected to the former using a common source region (G$_1$' represents gate electrode, 2' represents drain region). During operation, as shown in FIG. 23(B), when transistor N1 at one side is off and transistor N3 at the other side is on, it can be seen that channel current (drain current) flows into source region 1 and then becomes quite diffuse in this same region. Here, the data in FIGS. 23–25 were measured with a two-dimensional device simulator: MEDICI (made by TMA).

In other words, when transistor N1 is off and transistor N3 is on (FIGS. 23(B) and 25), of equivalent potential level layers 60, 61, 62, and 63 (there is a difference in potential of no more than 0.1 V between these equivalent potential level layers: this will be the same between layers hereinafter) formed in source region 1, an increase in potential as seen in layer 63 (and layer 64) is seen near the channel end because of inflowing current when transistor N3 is on. Along with this, an increase of no more than 0.2 V, as seen in layer 65, will be seen even in the channel end of transistor N1, which is off (refer to FIG. 25). In other words, it is clear that electrical potential of silicon region 1 beneath silicide layer 76 rises more than Vss, assuming a very normal Schottky barrier.

Then, in this state, when transistor N1 is turned on with transistor N3 on, as in FIG. 23(C), there is a 15% deterioration seen when the drive current is compared to the previous drive current for transistor N3. This is believed to be caused by the fact that the source potential of transistor N1 rises because transistor N3 is on (refer to FIG. 25), and potential near the channel end at the transistor N1 side, as shown in FIG. 23(B), further rises as seen in layer 63 because of the channel current of transistor N3 (resulting in an equivalent increase of about 0.2 V: increase of about 0.2 V effective threshold value).

Illustrating this with FIGS. 26 and 27, line A shows when only transistor N3 is on, and line B shows when transistors N3 and N1 are both on. This will be equivalent to the case in which the source potential has essentially increased due to the aforementioned rise of source region potential. As shown in FIG. 26, drive current when the MOS is on is fixed in both MOSes, and is therefore equal to the case in which threshold voltage of transistor N1 has effectively risen $V_{th1} \rightarrow V_{th2}$. In addition, since the rise in potential in the region at the floating side will be more noticeable the greater the MOS drive current, as shown in FIG. 27, maximum drive current must be drastically reduced (in other words, the drive current of transistor N1 must be less than that of transistor N3 when compared at the same $V_{th}$).

From the above, it has been illustrated with the cell structure shown in FIGS. 13–15 that the threshold value of transistor N1 readily rises due to silicification, and that this is remarkable when adjacent transistor N3 (for example, a transfer transistor as indicated by the imaginary lines in FIG. 12) is connected (interference effect caused by the adjacent cell). In addition, even when transistor N3 is temporarily absent, from the description above, it can be understood that source potential will rise more than Vss with the Schottky barrier caused by silicification with only transistor N1.

This type of electrical potential rise, i.e., increase in threshold potential in transistor N1, has an adverse effect on memory performance, and cell data will be easily destroyed. This is shown in FIG. 12. To take node Q from a high level state (data "1") to a low level (data "0") by turning transistor N1 on, since the threshold value of transistor N1 will be high, even taking node Q' to the high level will not turn transistor N1 on. In this instance, although node Q' should already have been at the high level and node Q should have been at the low level, transistor N2 will turn on to keep node Q at the high level, and node Q' at the high level will fall to the $Vss_2$ level (i.e., low level), making the data written in memory susceptible to destruction.

It is an object of this invention to provide a semiconductor device in the form of insulated gate, field effect semiconductor elements arranged in symmetry in which data retention ability and current drive ability in static memory cells, etc., are increased, so as to increase the degree of tolerance in device production processes, and to improve device performance.

SUMMARY OF THE INVENTION

This invention, then, pertains to a semiconductor device constructed with a number of insulated-gate field-effect semiconductor elements comprising a source region, a drain region, and a gate electrode provided between these two regions with insulation film(s) arranged to maintain symmetry to each other circuitwise (to construct, for example, a balanced flip-flop). Semiconductor regions of conductivity opposite that of the relevant source region or drain region are formed adjacent to these source regions or drain regions, Zener diodes are formed between each of these two regions, and each of these Zener diodes is connected between the aforementioned source region or drain region and the power supply or ground side.

With the semiconductor device of this invention, in a balanced flip-flop, e.g., static memory cell, constructed with MOS transistors, Zener diodes are arranged symmetrically in the source regions (or drain regions) of the transistors forming a pair and these Zener diodes are connected between the source region (or drain region) and the power supply or ground side. In this way, the aforementioned goals will be achieved. With these pairs of Zener diodes, it will be possible to greatly increase the operating margin boundaries that arise from the nonsymmetry inherent in a structure in which the moats connected to the power supply, as stated above, are separated, because of the reduction in cell area in transistors required to form the pair composing a cell latch. In other words, with this construction, since current to each source region (or drain region) of the transistors forming a pair will effectively flow to the power supply or ground side via the Zener diodes due to the tunneling effect already described, the rise in electrical potential in the source region (or drain region) already described will be decreased, and it will be possible to control the increase in transistor threshold values. In this way, symmetry of the paired transistors can be maintained, and performance, e.g., memory cell data retention and current drive ability, can be improved.

Thus, the semiconductor device in accordance with the invention is suitable for situations in which latch-type static memory cells are constructed and Zener diodes are formed in each of the source regions of the paired insulated-gate field-effect semiconductor elements that form these memory cell latches, or in cases in which sense amplifiers are constructed and Zener diodes are connected between each of the source regions of paired insulated-gate field-effect semiconductor elements, that are connected to the discharge circuit sections of these sense amplifiers, and the aforementioned discharge circuit sections.

In the semiconductor device in accordance with the invention, each of the source regions of the paired insulated-gate field-effect semiconductor elements can be constructed to be connected individually or in common to the power supply or ground side via a Zener diode.

In addition, the aforementioned semiconductor regions of opposite conductivity are formed adjacent to each of these source regions and these semiconductor regions are connected between the power supply of each source region and the semiconductor base. By using these semiconductor regions to fix the semiconductor substrate electrical potential (Vss, for example), the degree of integration of the device can be increased, and miniaturization can be achieved.

In addition, a silicide layer is formed spanning each surface of the aforementioned source regions and the aforementioned semiconductor regions with opposite conductivity as a structure that provides power supply contact. A power supply or ground side contact may be provided for this silicide layer, or individual power supply or ground side contacts may be provided for the aforementioned source region and aforementioned semiconductor region with opposite conductivity. Furthermore, a common power supply or ground side contact may be provided for the aforementioned source region and aforementioned semiconductor region with opposite conductivity.

When the aforementioned silicide layer ($TiSi_2$, for example) is formed, even when satisfactory ohmic characteristics and low contact resistance, as described above, are not obtained, since the aforementioned semiconductor region with opposite conductivity has been formed adjacent to the aforementioned source region, and the power supply or ground side is connected via the aforementioned Zener diode, a rise in electrical potential of the aforementioned source region can be effectively prevented, and problems caused by the Schottky barrier created by the aforementioned silicide layer can be resolved.

Thus, miniaturization of the semiconductor device can be achieved by forming the aforementioned silicide layer, and at the same time limited device manufacturing conditions required to control the aforementioned Schottky barrier (i.e., power supply contact resistance for the source) can be eliminated or relaxed, and so tolerance in production processes can be realized. In particular, a major degree of tolerance can be realized for fluctuations in silicification conditions and fluctuation in surface concentration in the source and drain regions, and for contact formation time variation, thus making production of good quality, highly integrated semiconductor devices at high yields possible.

BRIEF DESCRIPTION OF THE DRAWINGS

FIG. 2 is a schematic top view of the memory cell section in which a multiplicity of the memory cells of FIG. 1 have been combined.

FIG. 22 is a graph showing potential and diode current of the diode portion in this MOS transistor.

FIG. 25 is a potential distribution diagram when a quarter of these number of MOS transistors is on.

Figure 1:
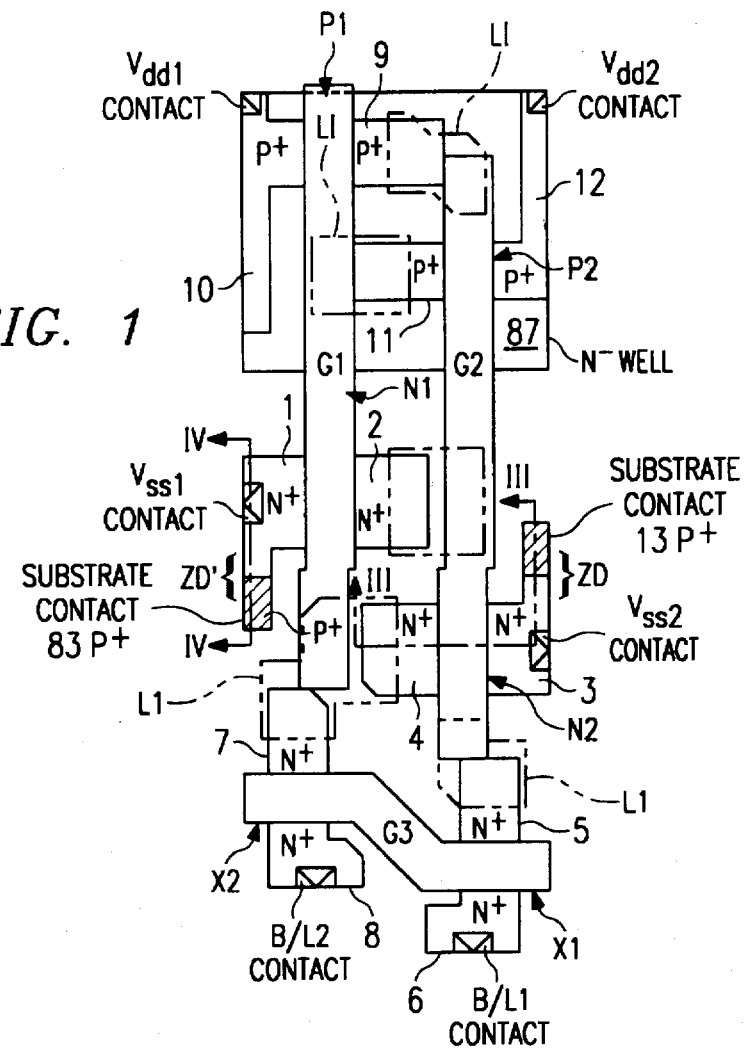
FIG. 1 is a schematic top view of a latch-type SRAM memory cell based on a first embodiment of the invention.

Reference numerals and symbols as shown in the drawings:

1, 2, 3, 4, 5, 6, 7, 8 . . . n$^+$-type semiconductor region (source or drain region)

9, 10, 11, 12 . . . p$^+$-type semiconductor region (source or drain region)

13, 83 . . . p$^+$-type semiconductor region (substrate contact)

47 . . . p$^-$-type silicon substrate 53, 93 . . . electrode or contact 76, 77 . . . silicide layer 87 . . . n$^-$-type well region N1, N2, N3, P1, P2, X1, X2 . . . MOS transistor $G_1, G_2$ . . . gate electrode LI . . . connecting conductor ZD, ZD' . . . Zener diode $Vss_1, Vss_2, Vdd_1, Vdd_2$ . . . power supply $B/L_1, B/L_2$ . . . bit line $W/L_1, W/L_2$ . . . word line cl DESCRIPTION OF THE PREFERRED EMBODIMENTS FIGS. 1–5 show a first embodiment of the invention as applied to a latch-type static memory (SRAM).

Figure 13:
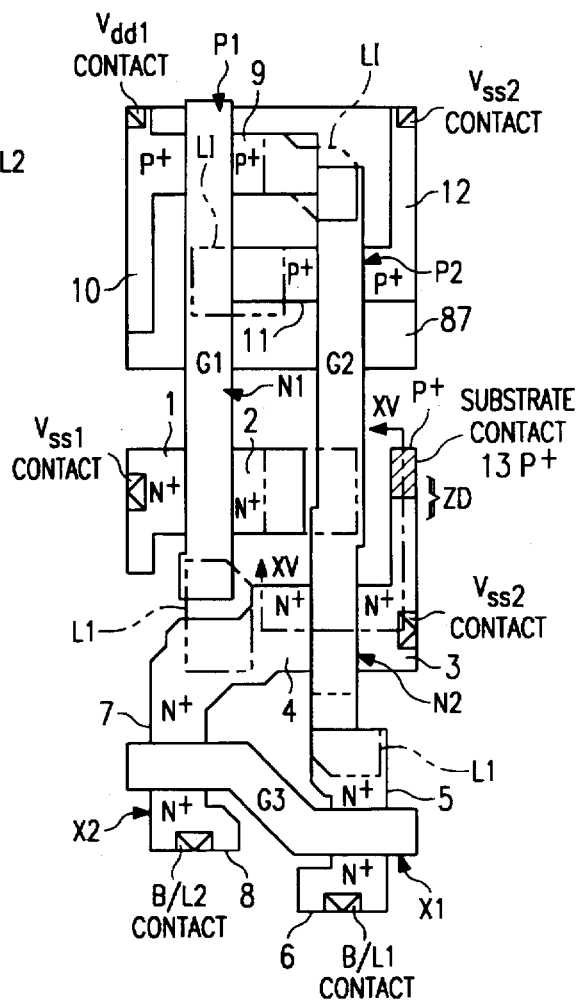
FIG. 13 is a schematic top view of the conventional memory cell of FIG. 12.
Figure 12:
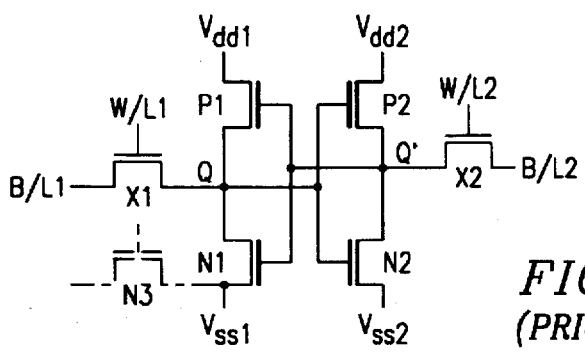
FIG. 12 is an equivalent circuit diagram of a conventional latch-type SRAM memory cell.
Figure 14:
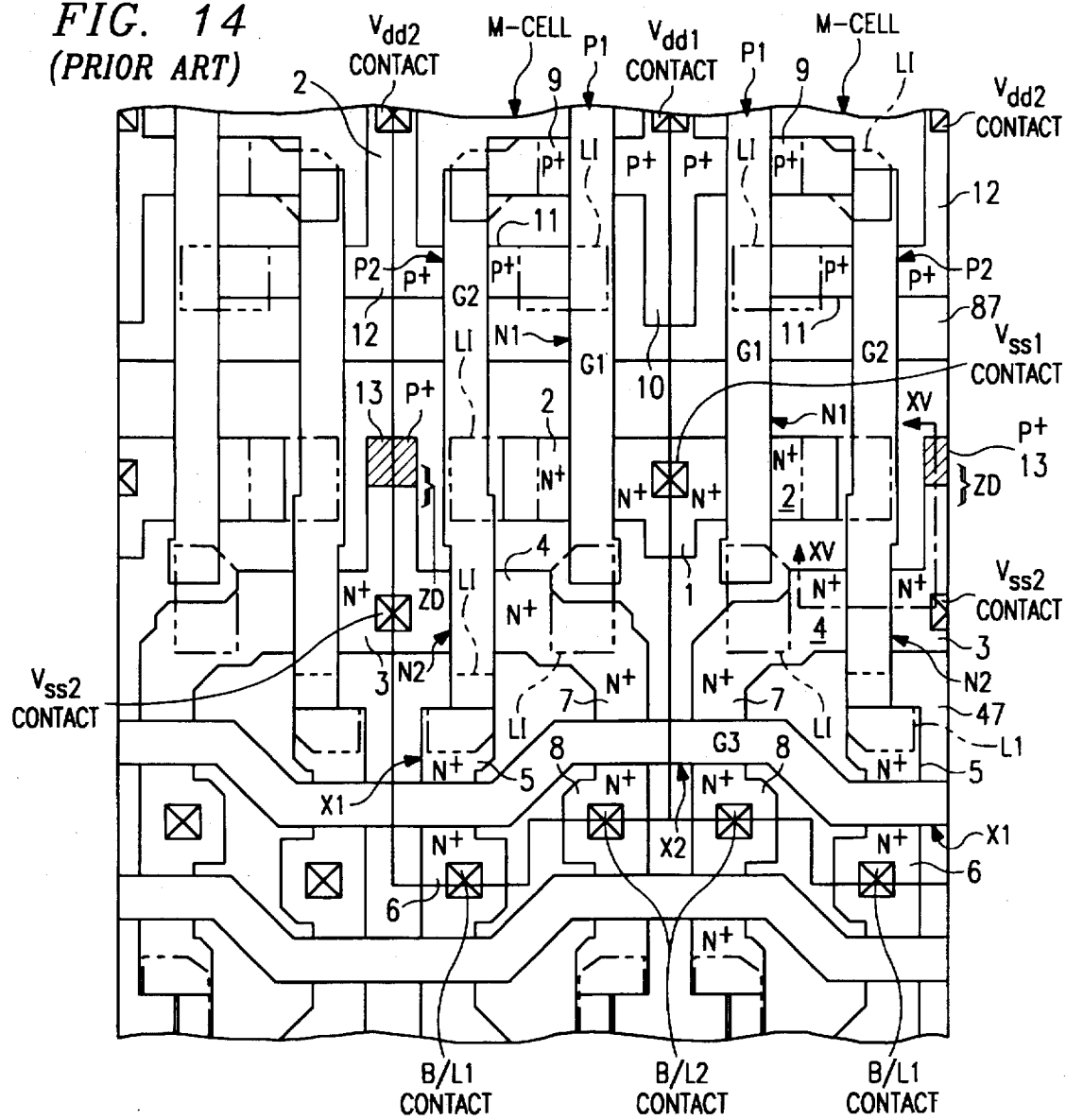
FIG. 14 is a schematic top view of a memory cell section in which a number of these memory cells have been combined.

The layout of the SRAM memory cell based on this embodiment, as shown in FIGS. 1 and 2, uses the same symbols for the parts common to it and the example in FIGS. 13–14, already described. Thus a description of these parts will be omitted. As a basic difference in construction, p$^+$-type semiconductor regions (substrate contact) 13 and 83 are formed adjacent to source regions 3 and 1, respectively, at both ends of paired MOS transistors N2 and N1, that form the cell latch. At the same time, Zener diodes ZD and ZD', like those described previously, are connected between each source region and power supplies $Vss_2$ and $Vss_1$. In this example, transistors N1 and N2 are provided on a p$^-$-type substrate and transistors P1 and P2 are provided in the n-type well region.

Figure 3:
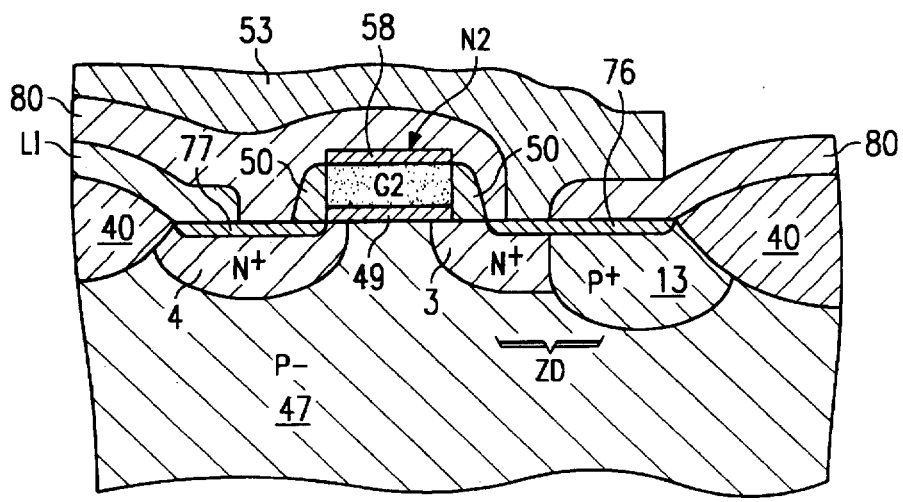
FIG. 3 is a cross section along line III—III in FIGS. 1 and 2.
Figure 4:
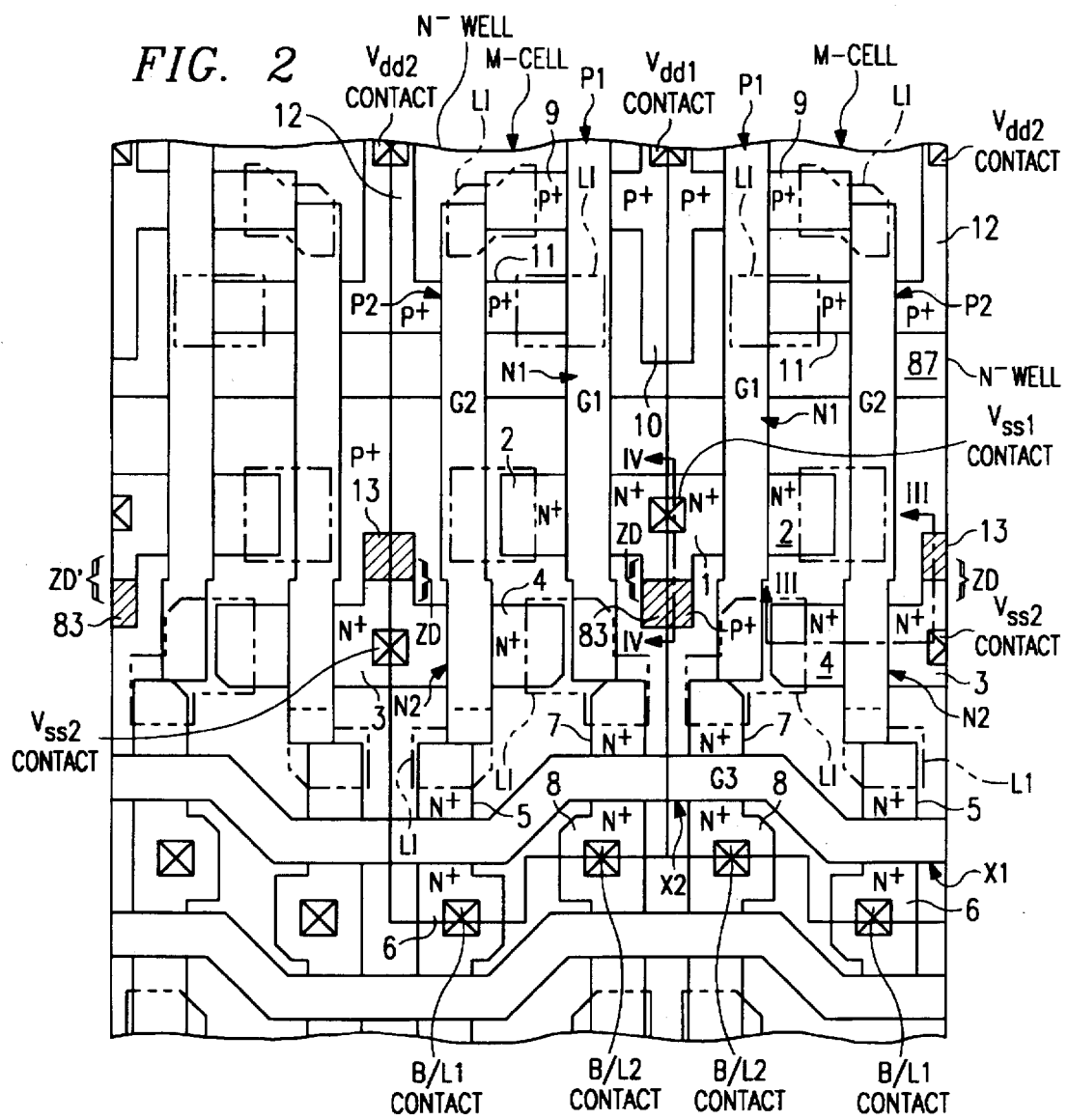
FIG. 4 is a cross section along line IV—IV in FIGS. 1 and 2.
Figure 15:
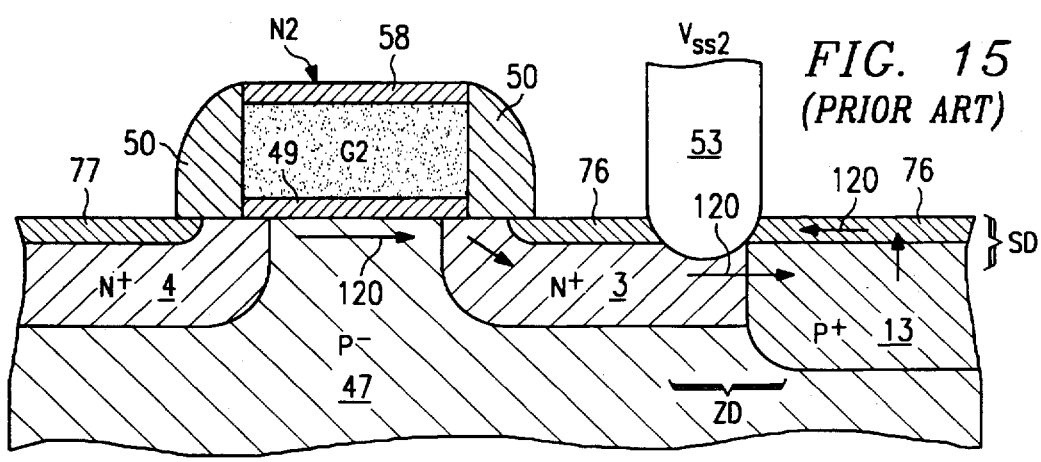
FIG. 15 is an enlarged schematic cross section of one portion illustrating the current path via a Zener diode in a MOS transistor of this memory cell.

FIGS. 3 and 4 show cross sections of each portion in which Zener diodes ZD and ZD' described above are provided. FIG. 3 shows the portion with transistor N2, as was described with FIG. 15 (here, 80 in the figure represents an interlayer insulating film). FIG. 4 shows a basic variation of a conventional structure in which silicide layer 76 is simply provided on source region 1 of transistor N1. Here, as in FIG. 3, p$^+$-type semiconductor region 83 is provided adjacent, and Zener diode ZD' is formed (here, 93 in the figure represents power supply $Vss_1$ electrode).

Figure 5:
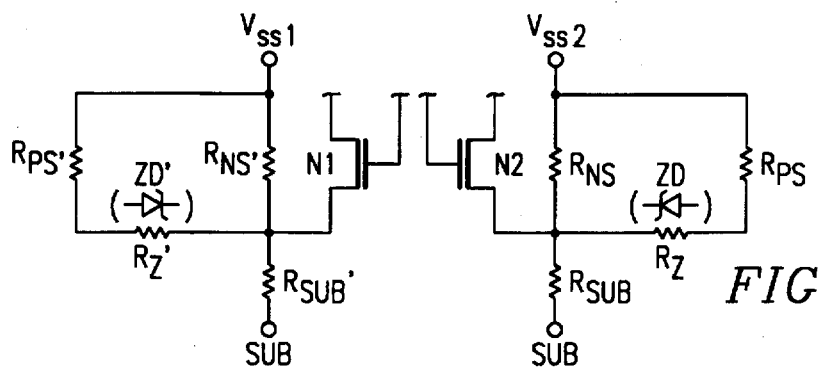
FIG. 5 is an equivalent circuit diagram of the major portions of the memory cell of FIG. 1.
Figure 16:
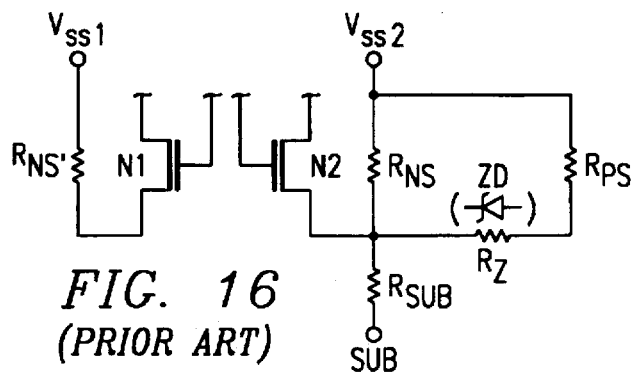
FIG. 16 is an equivalent circuit diagram of the major portions of this memory cell.
Figure 17:
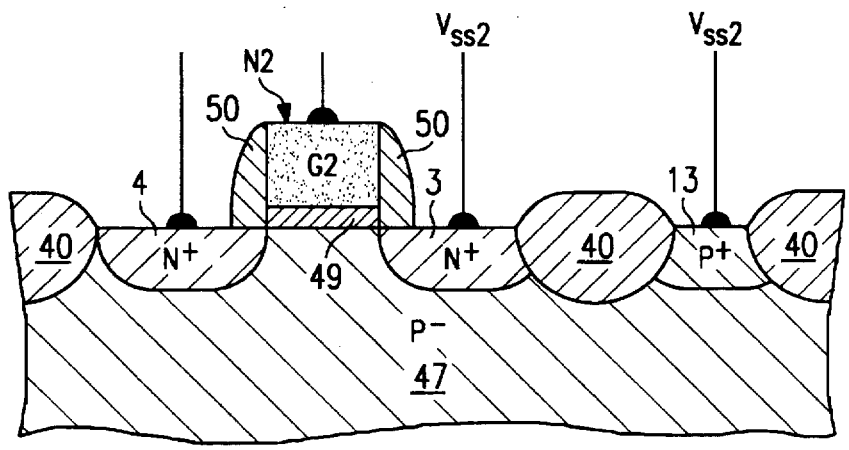
FIG. 17 is a schematic cross section of a conventional MOS transistor.
Figure 18:
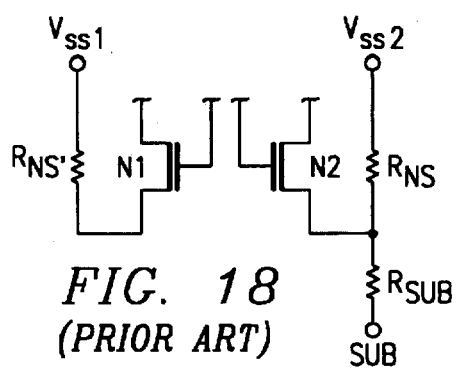
FIG. 18 is an equivalent circuit diagram of the major portions of a memory cell in which transistors of the type shown in FIG. 17 have been combined.
Figure 19:
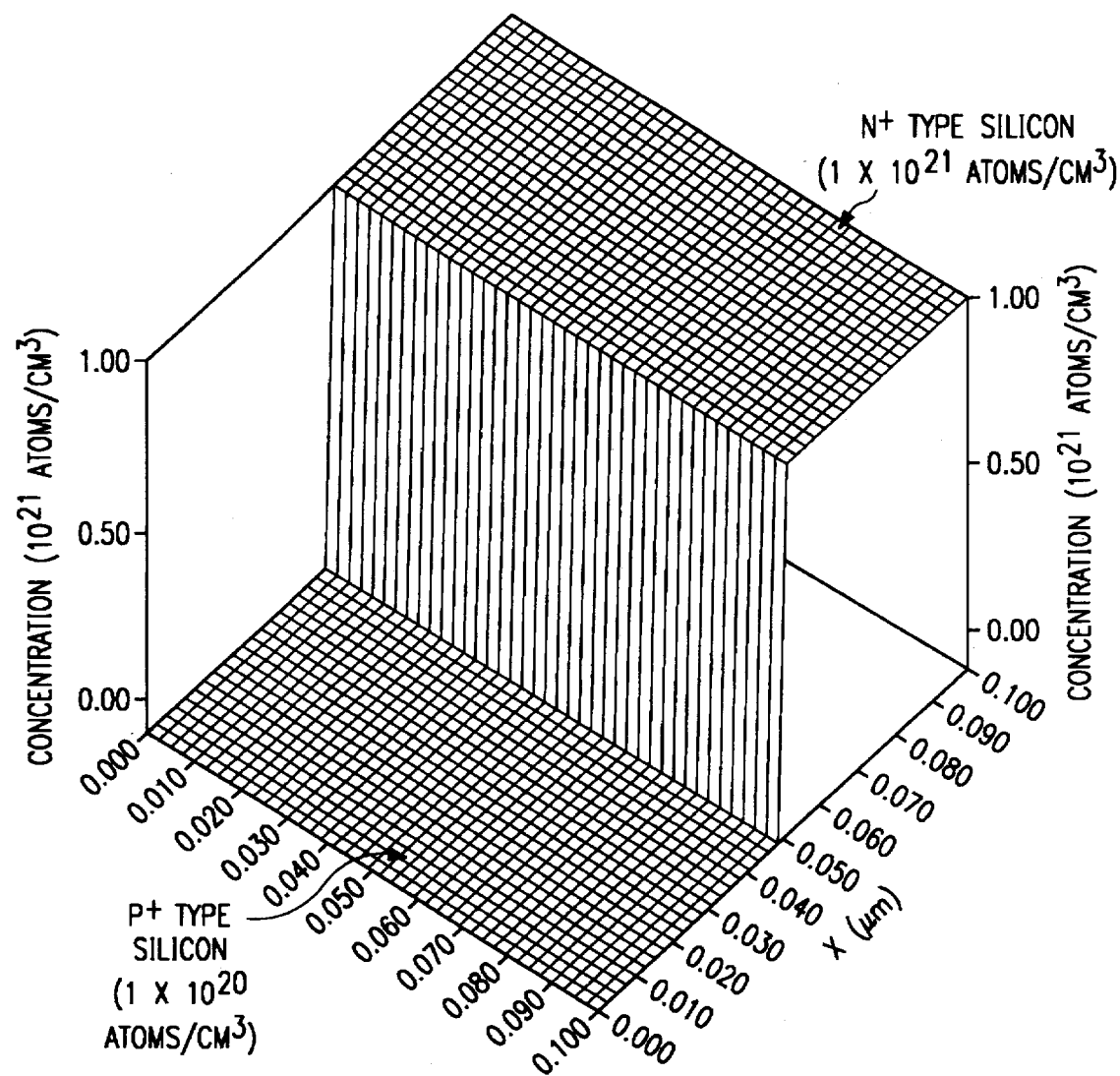
FIG. 19 is a profile of the impurity concentration in the Zener diode portion of the MOS transistor in FIG. 15.
Figure 20:
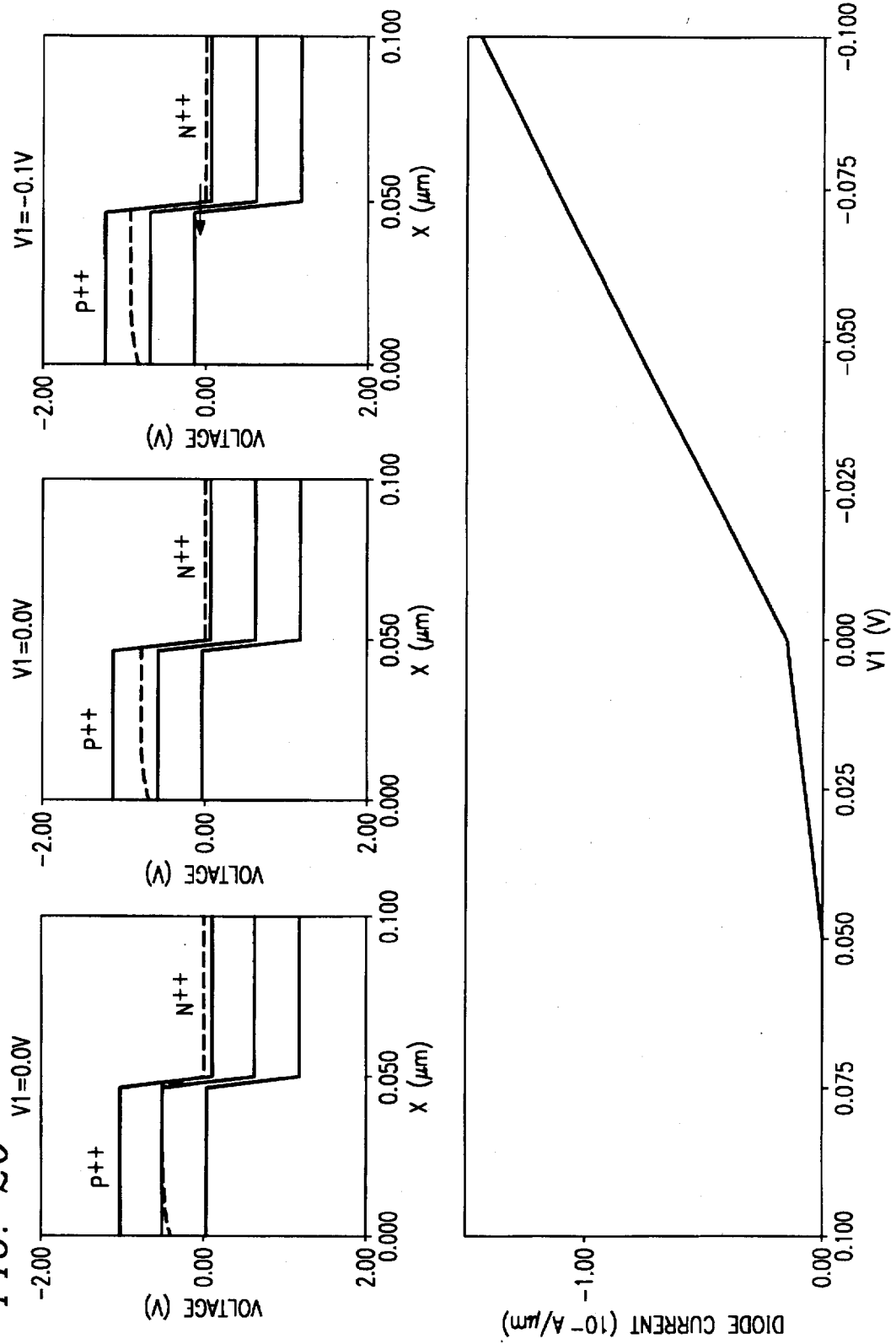
FIG. 20 is a graph showing potential and diode current in the Zener diode portion of the same MOS transistor.
Figure 21:
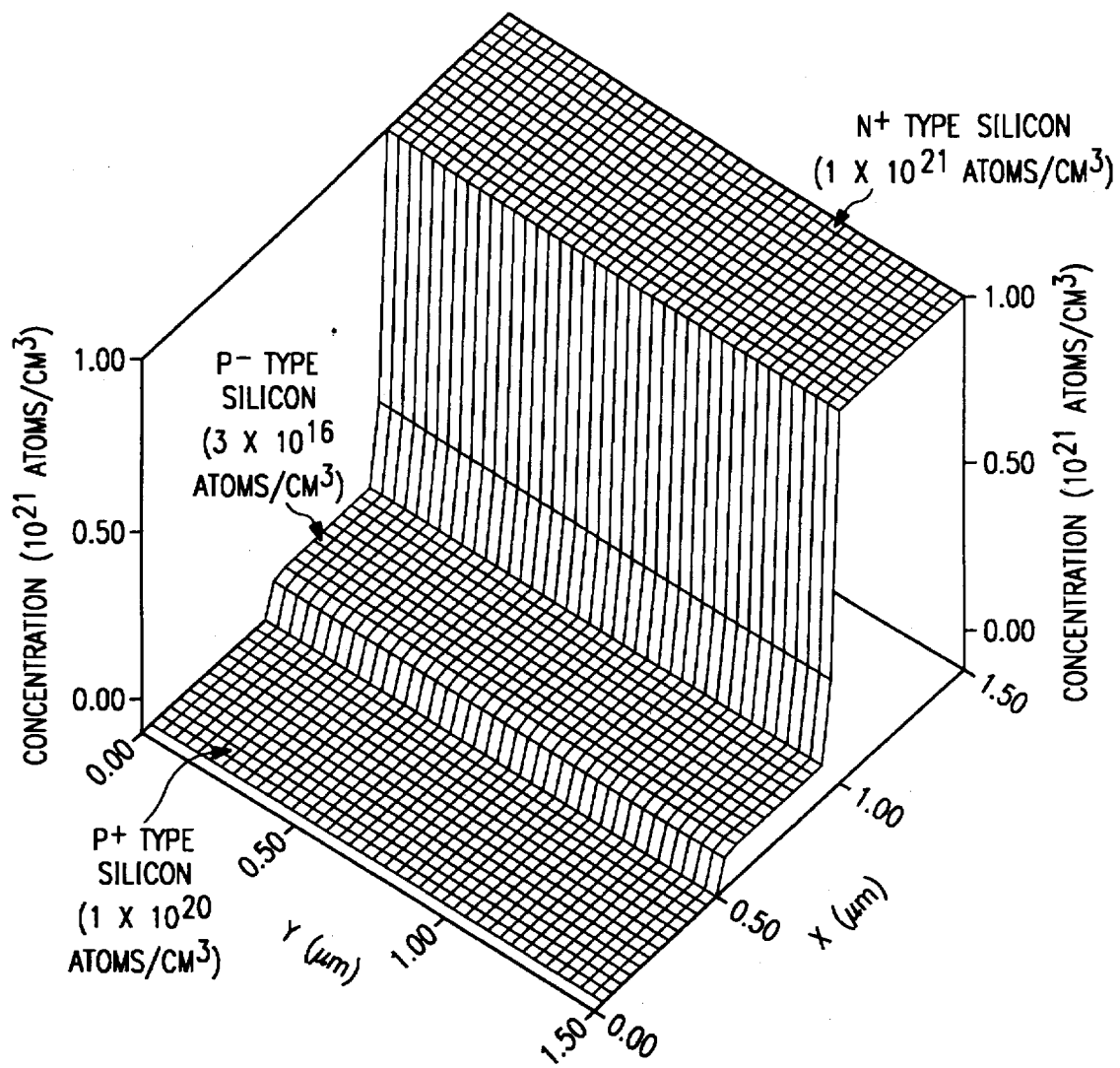
FIG. 21 is a profile of the impurity concentration in the diode portion of a MOS transistor that has no Zener diode.
Figure 23A:
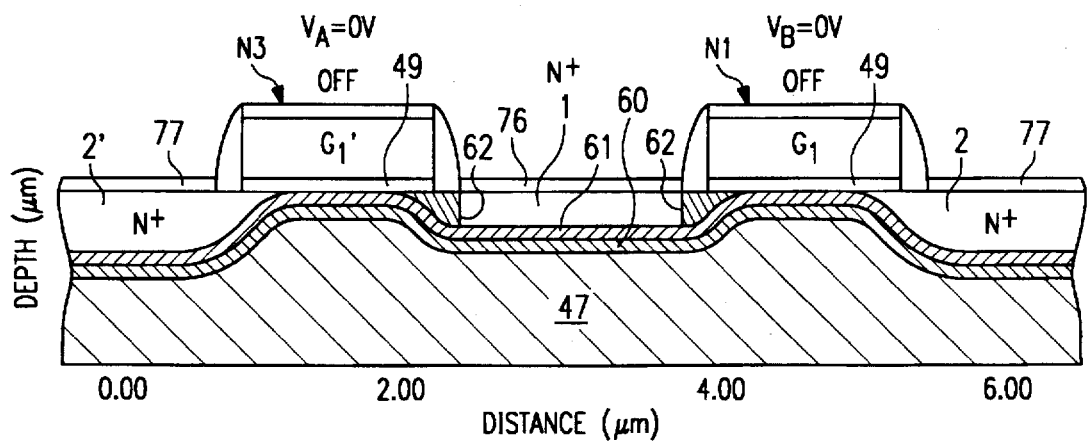
FIG. 23 is a schematic cross section with appended potential distribution to illustrate the phenomenon of MOS transistor source potential rise.
Figure 23B:
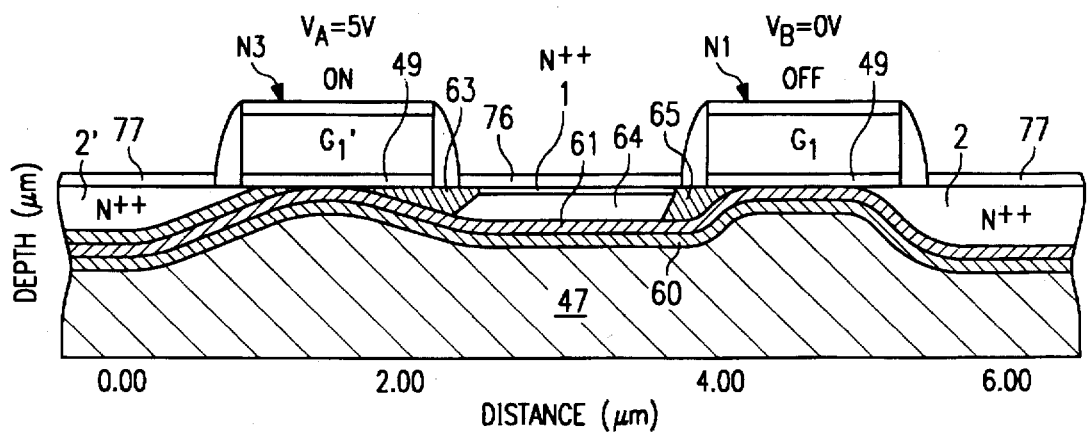
Figure 23C:
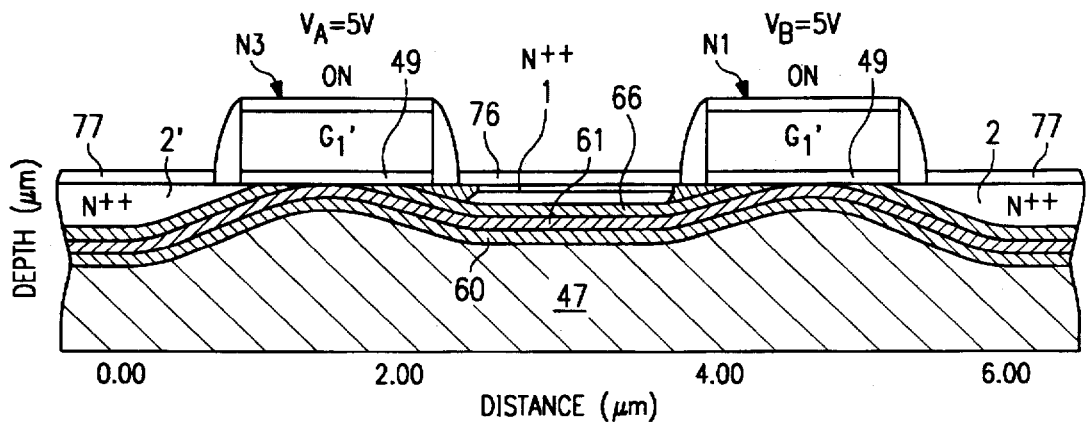
Figure 24:
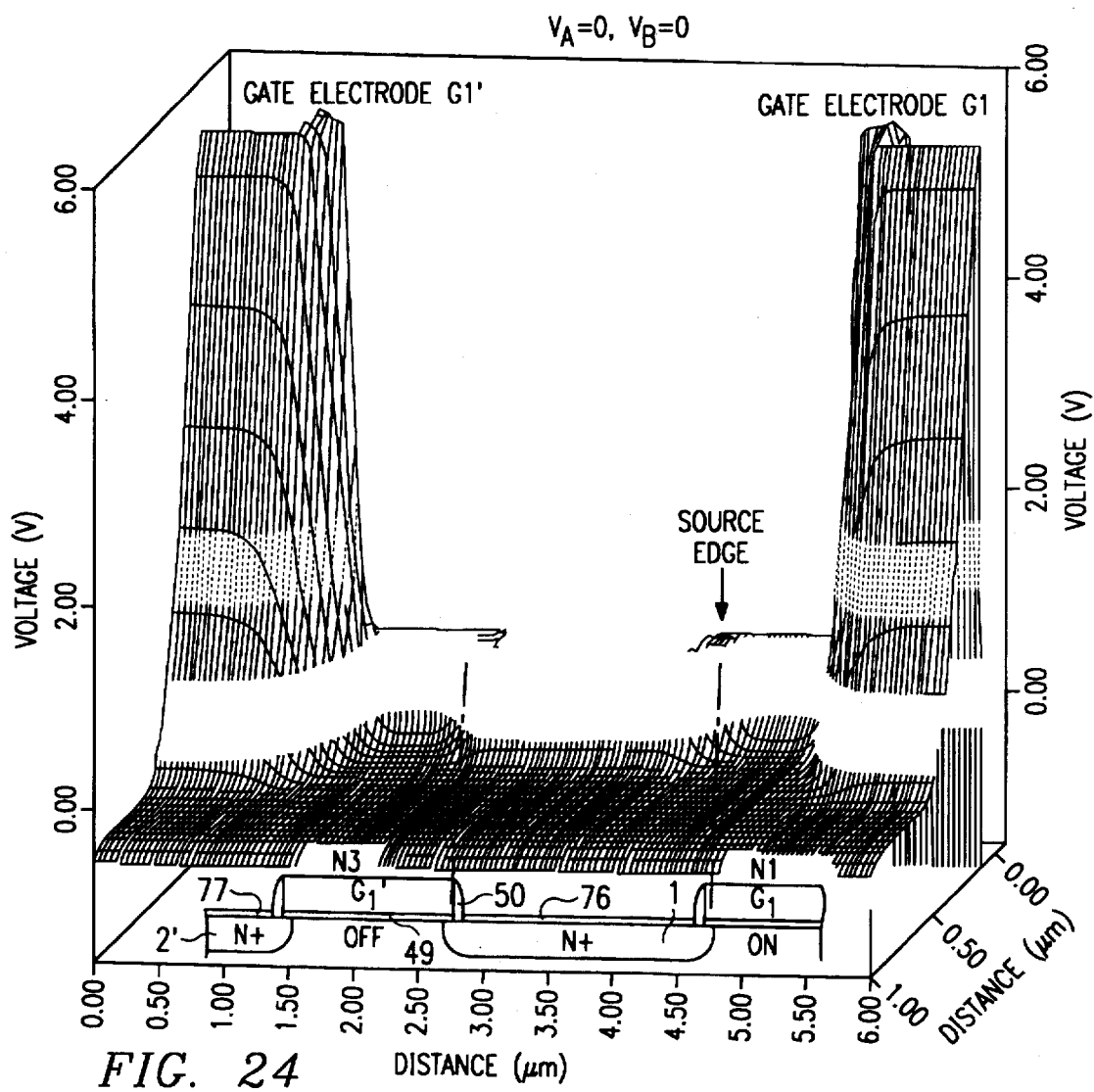
FIG. 24 is a potential distribution diagram when the number of MOS transistors are off.
Figure 26:
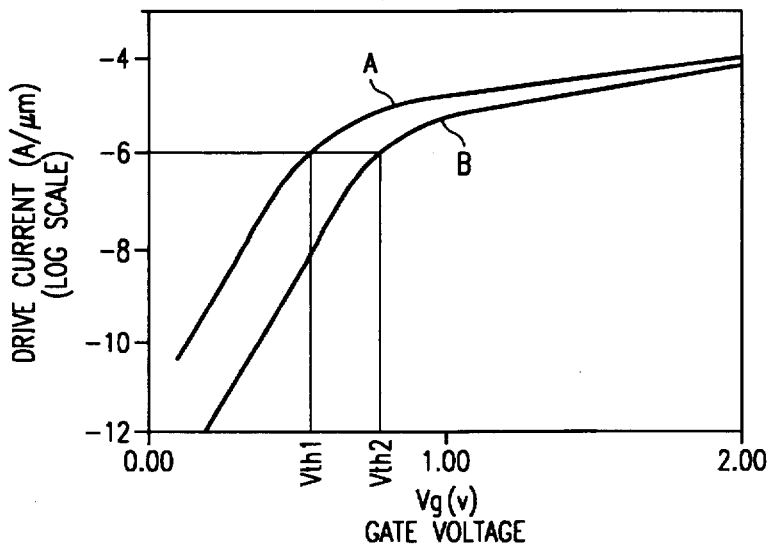
FIG. 26 is a graph showing drive current of these number of MOS transistors on a log scale.
Figure 25:
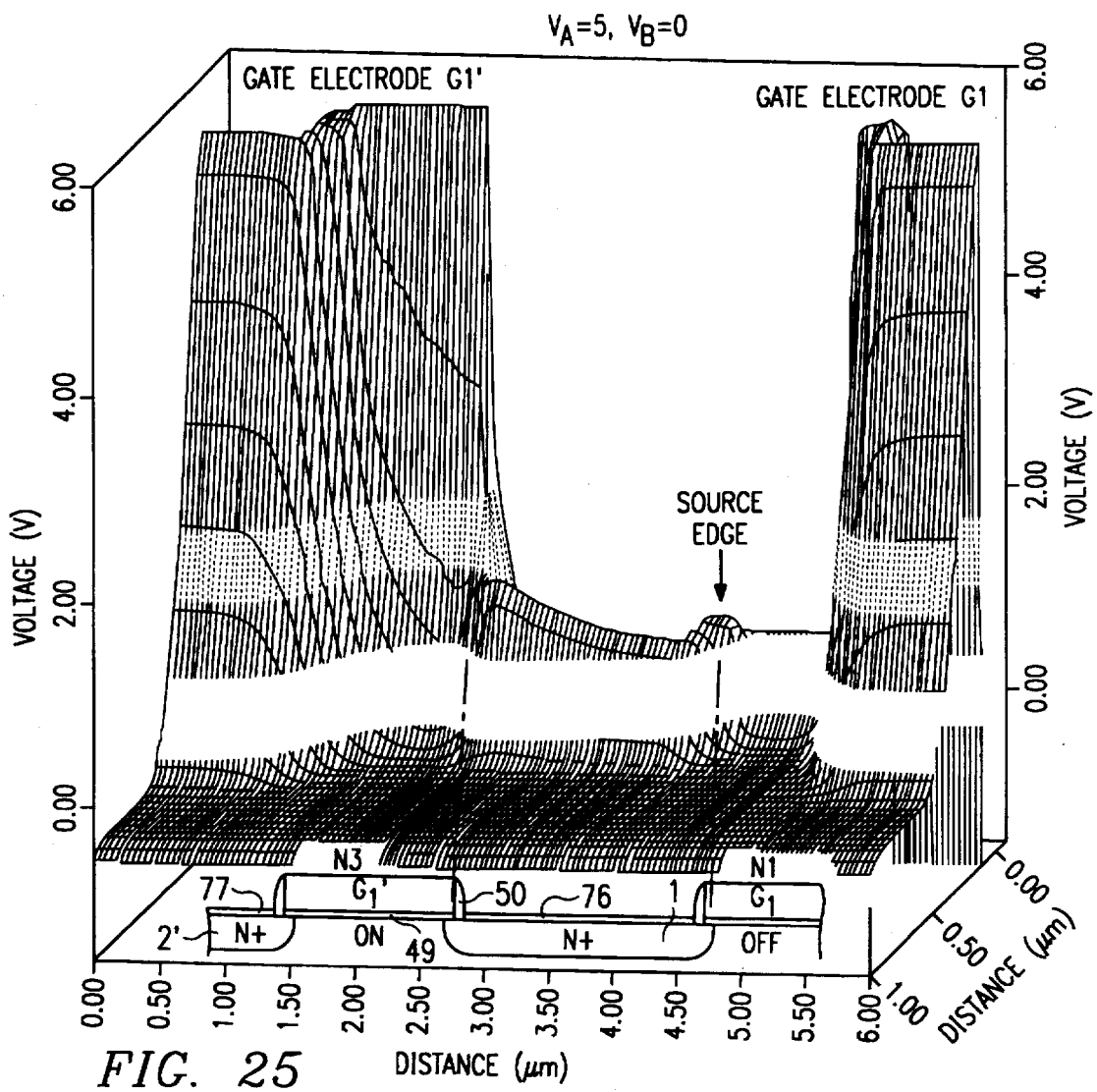
Figure 27:
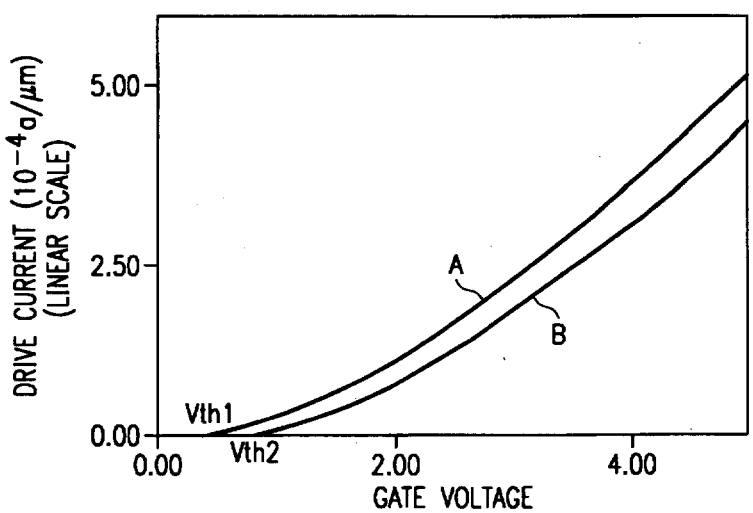
FIG. 27 is a graph showing drive current of these number of MOS transistors on a linear scale.

FIG. 5 shows an equivalent circuit of the parts with paired transistors N2 and N1. When compared to the circuit in FIG. 16 that has already been described, diode resistance $R_z'$ from Zener diode ZD', contact resistance with the silicide layer $R_{NS}'$ and $R_{PS}'$, and substrate bulk resistance $R_{SUB}'$ are each connected to transistor N1, also, symmetrical with the transistor N2 side (these resistances are each equivalent to those on the transistor N2 side).

As stated above, since Zener diodes ZD and ZD' are arranged symmetrically at both transistors N2 and N1, that form the memory cell pair, current to source regions 3 and 1 of transistors N2 and N1 will flow effectively to power supplies $Vss_2$ and $Vss_1$ via Zener diodes ZD and ZD' by the tunneling effect already discussed. So, the rise in electric potential of source region 1 already discussed can be decreased, and the increase in transistor N1 threshold value can be controlled.

In this way, during the data writing operation, transistor N1 will turn on and off normally, when node Q' is brought to the high level, node Q can be brought to the low level (data "0") by grounding toward $Vss_1$ with transistor N1 on, and node Q' at the high level can be maintained by having transistor N2 off. Therefore, data written in the memory will not be destroyed, and the data retention ability can be increased.

In addition, not only can the device be made smaller by forming silicide layers 76 and 77, but by eliminating or doing away with limited device production conditions necessary for controlling the Schottky barrier discussed above (i.e., power supply contact resistance for the source), tolerance in the production process will be made possible. In particular, a major degree of margin can be realized for fluctuations in silicification conditions and fluctuations in surface concentration in the source and drain regions, and for contact formation time variation, thus making production of good quality, highly integrated devices at high yields possible.

Figure 6:
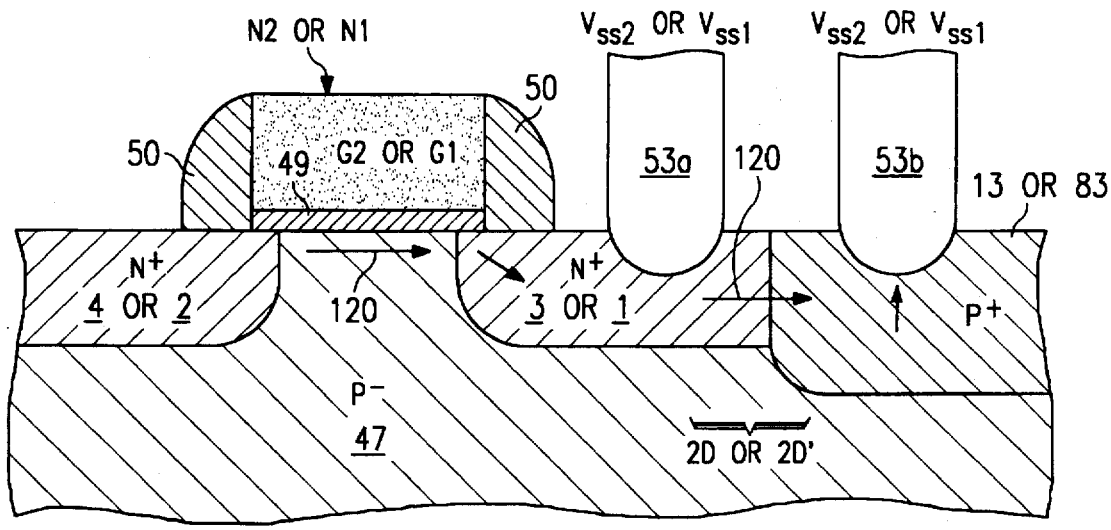
FIG. 6 is an enlarged schematic cross section of one portion illustrating the current path via a Zener diode in a MOS transistor of a memory cell based on a second embodiment of this invention.

FIG. 6 shows a second embodiment of the invention. This embodiment, unlike the first embodiment, uses a power supply contact with no silicide layer. In other words, contacts 53a and 53b for $Vss_2$ and $Vss_1$ are used on each transistor N2 and N1 independent of source region 3 or 1 and semiconductor region 13 or 83.

In other words, contact 53a is connected to source region 3 or 1, and contact 53b is connected to $p^+$-type semiconductor region 13 or 83. These contacts are connected at individual locations and can be directed to a common power supply wiring.

Not only will the same operating effects be achieved with this construction as with the first embodiment, but high integration can be realized without considering the problem of the Schottky barrier, since no silicide layer is provided.

Figure 7:
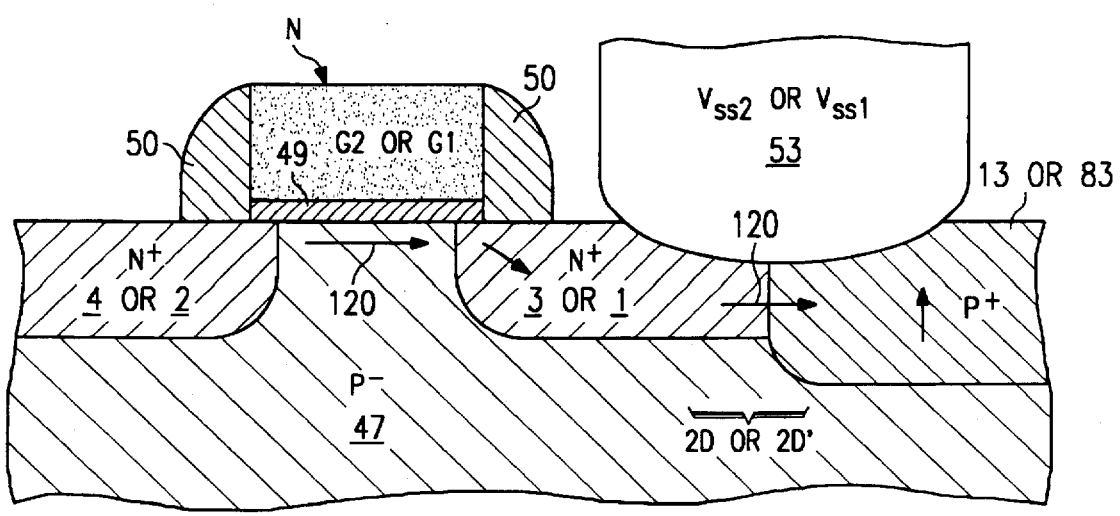
FIG. 7 is an enlarged schematic cross section of one portion illustrating the current path via a Zener diode in a MOS transistor of a memory cell based on a third embodiment of this invention.

FIG. 7 shows a third embodiment of the invention. With this embodiment, in contrast to the individual power supply contacts used in the second embodiment, power supply contact 53 has been made larger and is commonly used for source region 3 or 1 and for semiconductor region 13 or 83.

Not only will the same operating effects be achieved with this construction as with the first and second embodiments, but contact formation will be easier with the aforementioned common power supply contact.

Figure 8:
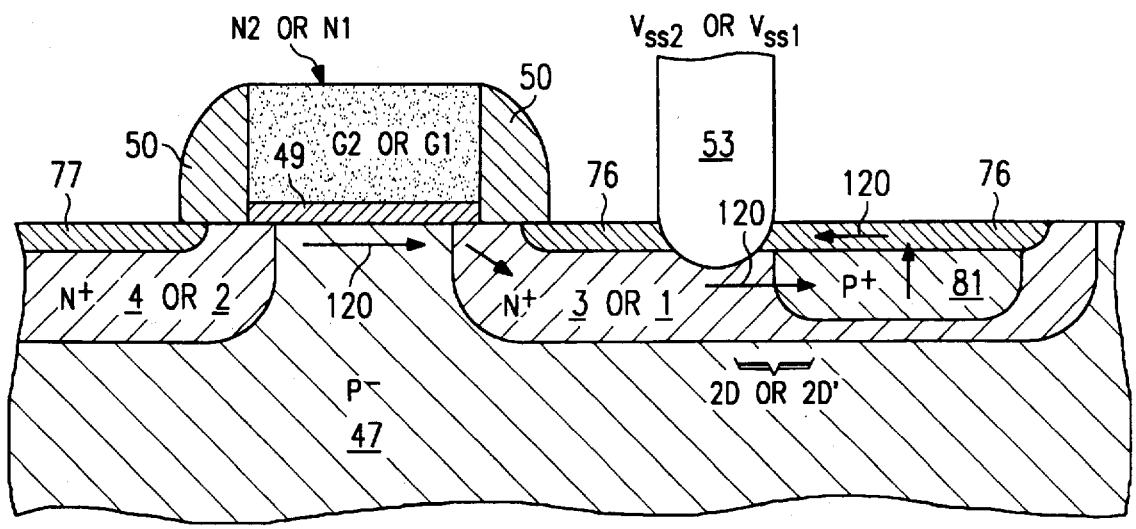
FIG. 8 is an enlarged schematic cross section of one portion illustrating the current path via a Zener diode in a MOS transistor of a memory cell based on a fourth embodiment of this invention.

FIG. 8 shows a fourth embodiment of the invention. A structure in which the source region and the substrate contact region are adjacent to each other was discussed in each of the first through third embodiments, but this adjacent construction may be mixed with an independent construction, as in FIG. 8, or a construction in which each is independent may also be used.

In short, to connect the Zener diode to source region 3 or 1, the entire perimeter of $p^+$-type semiconductor region 81 of opposite conductivity, is enclosed by source region 3 or 1. $p^+$-type semiconductor region 13 or 83 will be provided at a different position, not shown.

With this type of construction, also, the same operating effects as those discussed for the first embodiment will be obtained with Zener diode ZD or ZD'.

Figure 9:
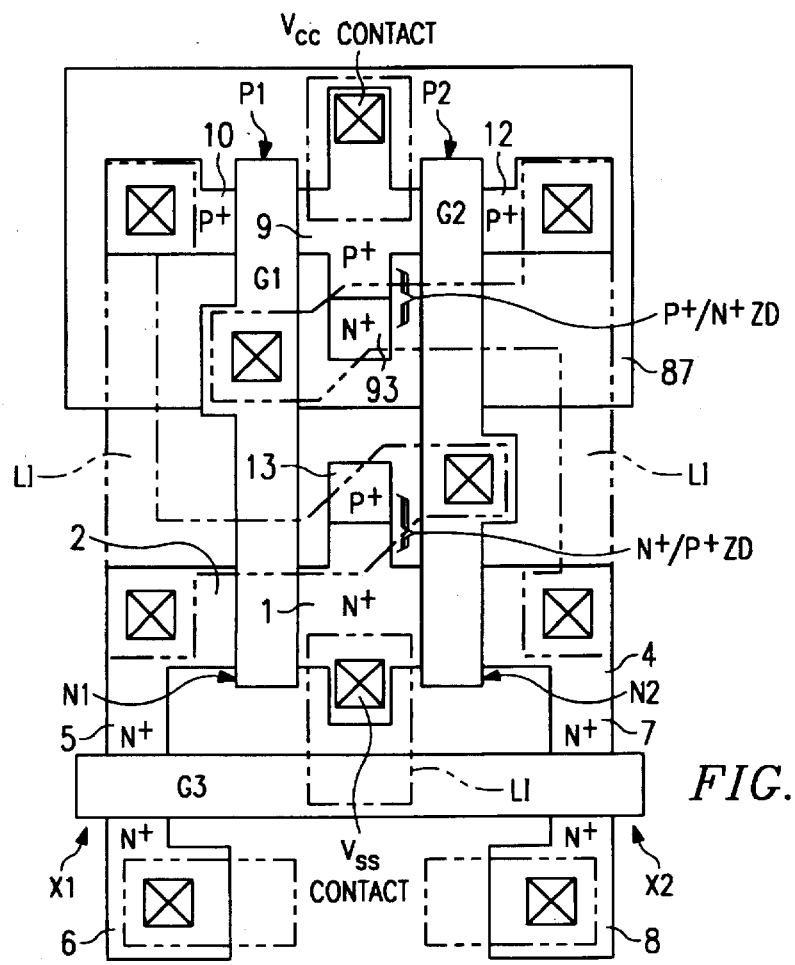
FIG. 9 is a schematic top view of a latch SRAM memory cell based on a fifth embodiment of the invention.
Figure 10:
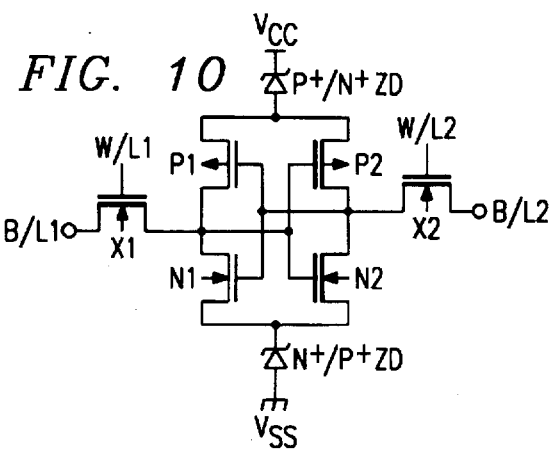
FIG. 10 is an equivalent circuit diagram of the major parts of the memory cell of FIG. 9.

FIGS. 9 and 10 show a fifth embodiment of the invention. The SRAM memory cell in this embodiment, when compared to the first embodiment, has a common source region for transistors N1 and N2. $p^+$-type semiconductor region 13 is provided adjacent to this common source region 1, a Zener diode ($n^+/p^+$ZD) is formed between these, and, as discussed in FIG. 3, there is a common connection to power supply Vss (here, silicide layer 76 is omitted from the diagram). At the same time, there is a common source region in transistors P1 and P2, also. $n^+$-type semiconductor region 93 is provided adjacent to this common source region 9, a Zener diode ($p^+/n^+$ZD) is formed between these, and with a common connection to power supply Vcc (here, the silicide layer is omitted from the diagram).

Thus, a rise in electric potential of source region 1 can be reduced by the aforementioned common Zener diode $n^+/p^+$ZD, symmetry of transistors N1 and N2 can be maintained, and the data retention ability can be increased. Therefore, a rise in electric potential in drain region 9 can be reduced by the aforementioned common Zener diode $p^+/n^+$ZD.

Not only will the same operating effects be achieved with this construction as with the first embodiment, but since current drive ability will be increased by the aforementioned Zener diode even when the paired transistor source regions are connected in common to the power supply, reliable operation will be possible.

Figure 11:
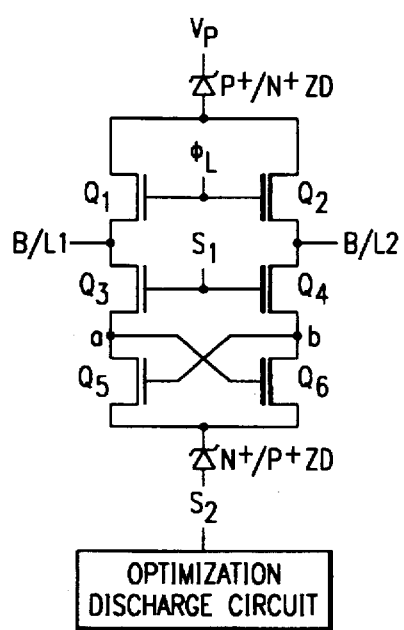
FIG. 11 is an equivalent circuit diagram of a sense amplifier based on a sixth embodiment of the invention.

FIG. 11 shows a sixth embodiment of the invention. This embodiment applies the invention to a sense amplifier, in place of the SRAM described above, that requires electrical symmetry like the SRAM. This sense amplifier, as shown in FIG. 11, includes a flip-flop circuit. When the sense amplifier is activated by a gradual drop in $S_2$ potential at the point where a minute potential difference occurs in the right and left bit lines $B/L_1$ and $B/L_2$ from the dynamic RAM, only the lower potential from the left and right nodes a and b is discharged through transistor $Q_5$ or $Q_6$, amplifying the difference in potential. At the point in which a sufficient difference in potential occurs between nodes a and b, $S_2$ immediately drops to 0 V, bringing the low potential side completely to 0 V. The recharging circuit is then activated and only the bit line at the high potential side is recharged to the Vcc level. In this way, after the sense amplifier has determined "H" or "L" for the right or left bit line where a minute difference in potential has occurred, bit line potential on the "H" side is made a full "H" level, the bit line on the "L" side is brought to a full "L" level and the data are once more written to the memory cell (=rewrite and refresh).

In this sense amplifier, a Zener diode $n^+/p^+$ZD is connected to the common source region at the discharge circuit side of transistors $Q_5$ and $Q_6$, and a Zener diode $p^+/n^+$ZD is connected, as described above, to the drain region at the power supply side of transistors $Q_1$ and $Q_2$. Thus, even in this embodiment, current drive ability can be increased while transistor operation symmetry is maintained by the Zener diodes, and satisfactory sensing can be performed.

Each of the embodiments of the invention as described may be subject to further variations based on the technical concept of the invention. For example, the size and layout of each semiconductor region that forms the Zener diodes, and the construction of the MOS transistors, materials in each part, and the production processes and conditions may be varied. In addition, the conductivity type of the semiconductor regions described above may be changed to the opposite type.

Note that this invention may be applied to semiconductor devices other than the aforementioned CMOS devices and SRAM devices, and may also be applied to other types of devices. For example, the invention may be applied to well-known high-resistance load type and E/D type devices as the SRAM, and may also be applied to SRAMs made of thin film MOS transistors (for example, devices in which an n-channel MOS is formed on the silicon substrate side and a TFT p- channel MOS is formed on the silicon substrate).

The invention, as stated above, is constructed with a number of insulated-gate field-effect semiconductor elements arranged to maintain symmetry with each other circuitwise (to construct, for example, a balanced flip-flop structure). Semiconductor regions with opposite conductivity are formed adjacent to their respective source region or drain region, Zener diodes are formed between these two regions, and each of these Zener diodes is connected between its respective source region or drain region and the power supply or ground side. Therefore, current to each source region or drain region in the paired semiconductor elements effectively flows to the power supply or ground side via the Zener diodes, and thus a rise in the electric potential of the source region or drain region can be decreased and an increase in the transistor threshold value can be controlled. Because of this, symmetry of the paired semiconductor elements can be maintained, and performance, e.g., memory cell data retention ability and current drive ability, can be improved.

In addition, the semiconductor regions with opposite conductivity that are adjacent to the source regions form the Zener diodes therewith, and when the Zener diodes are connected between the source region power supply and the semiconductor substrate and are used to fix the semiconductor substrate potential, the degree of integration of the device can be increased, and miniaturization of the device can be achieved.

In addition, when a silicide layer spanning each surface of the source region and the semiconductor region of opposite conductivity is provided, not only can the semiconductor device be made small, but limited device production conditions necessary to control the aforementioned Schottky barrier (i.e., power supply contact resistant for the source) can be eliminated or relaxed, and thus some tolerance can be brought into the production process. In particular, a major degree of tolerance can be realized for fluctuations in silicification conditions and fluctuations in surface concentration in the source and drain regions, and for contact formation time variation, thus making production of good quality, highly integrated semiconductor devices at high yields possible.

We claim:

1. A semiconductor device comprising:

power supply contacts for a supply voltage contact and a ground;

a primary group of semiconductor regions, comprising a number of symmetrically paired insulated-gate field-effect semiconductor elements, each having a source region, a drain region, and an insulated-gate electrode between the source and drain regions, circuitwise-symmetrically arranged;

a secondary group of semiconductor regions having conductivity opposite that of their relevant source region or drain region, symmetrically formed adjacent to the source and drain regions; and a group of corresponding zener diodes, formed between corresponding semiconductor regions of the primary and secondary groups, for symmetrically coupling the source and drain regions to corresponding power supply contacts.

2. The semiconductor device of claim 9 wherein a latch-type static memory cell is formed, and in which zener diodes are formed in the source regions of the paired insulated-gate field-effect semiconductor elements that form the cell latch of this memory cell.

3. In a latch-type circuit having a voltage supply electrode; a semiconductor substrate; first and second identical FETs formed on the substrate, each having a source, a drain, and a gate, symmetrically disposed in the latch-type circuit; a silicide layer coupling the first FET's source to the voltage supply electrode via a Schottky barrier; and a circuit substrate contact of conductivity opposite that of the sources, formed on the substrate adjacent the first FET's source and coupled to the voltage supply electrode; the circuit substrate contact forming a zener diode with the first FET's source which introduces circuit asymmetry between the first and second FETs;

the improvement comprising a balancing substrate contact of conductivity opposite that of the sources, formed on the substrate adjacent the second FET's source to make a zener diode with the second FET's source, coupled to the voltage supply electrode, thereby restoring circuit symmetry.

4. The circuit of claim 3 wherein the latch-type circuit comprises a tip-flop.

5. The circuit of claim 3 wherein the circuit is a memory cell.

6. The circuit of claim 4 wherein the circuit is an SRAM.

* * * * *